(12) United States Patent
Lee et al.

(10) Patent No.: US 11,557,689 B2
(45) Date of Patent: Jan. 17, 2023

(54) INTEGRATED TANDEM SOLAR CELL AND MANUFACTURING METHOD THEREOF

(71) Applicant: KOREA INSTITUTE OF SCIENCE AND TECHNOLOGY, Seoul (KR)

(72) Inventors: Doh Kwon Lee, Seoul (KR); Yoon Hee Jang, Seoul (KR); In Ho Kim, Seoul (KR); Thi Kim Cuc Mai, Seoul (KR); Wan Soo Son, Seoul (KR); Jeung hyun Jeong, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 16/875,131

(22) Filed: May 15, 2020

(65) Prior Publication Data

US 2021/0159356 A1 May 27, 2021

(30) Foreign Application Priority Data

Nov. 27, 2019 (KR) ........................ 10-2019-0154193

(51) Int. Cl.
*H01L 25/00* (2006.01)
*H01L 31/00* (2006.01)
(Continued)

(52) U.S. Cl.
CPC .. *H01L 31/0725* (2013.01); *H01L 31/022475* (2013.01); *H01L 31/022483* (2013.01);
(Continued)

(58) Field of Classification Search
CPC .......... H01L 31/0725; H01L 31/03845; H01L 31/0326; H01L 31/0749; H01L 31/022483;
(Continued)

(56) References Cited

FOREIGN PATENT DOCUMENTS

KR 101958930 B1 3/2019

OTHER PUBLICATIONS

Yusoff ("Extremely stable all solution processed organic tandem solar cells with TiO2/GO recombination layer under continuous light illumination") (Year: 2013).*

(Continued)

*Primary Examiner* — Angelo Trivisonno
(74) *Attorney, Agent, or Firm* — Rabin & Berdo, P.C.

(57) ABSTRACT

An integrated tandem solar cell includes a first solar cell including a rear electrode, a light absorption layer disposed on the rear electrode, and a buffer layer disposed on the light absorption layer; a recombination layer including a first transparent conductive layer disposed on the buffer layer; a nanoparticle layer that is transparent and conductive, that is disposed on the first transparent conductive layer, and that planarizes the first solar cell; and a second transparent conductive layer disposed on the nanoparticle layer; and a second solar cell that is a perovskite solar cell including a perovskite layer and that is disposed on and bonded to the second transparent conductive layer of the recombination layer. The recombination layer electrically joins the first and (Continued)

second solar cells and planarizes the first solar cell so that the second solar cell is uniformly deposited in all regions thereof.

13 Claims, 8 Drawing Sheets
(5 of 8 Drawing Sheet(s) Filed in Color)

(51) Int. Cl.
| | |
|---|---|
| *H02S 10/00* | (2014.01) |
| *H01L 31/0725* | (2012.01) |
| *H01L 31/0384* | (2006.01) |
| *H01L 31/032* | (2006.01) |
| *H01L 31/0749* | (2012.01) |
| *H01L 31/0224* | (2006.01) |
| *H01L 31/18* | (2006.01) |

(52) U.S. Cl.
CPC ...... *H01L 31/0322* (2013.01); *H01L 31/0326* (2013.01); *H01L 31/03845* (2013.01); *H01L 31/0749* (2013.01); *H01L 31/1864* (2013.01); *H01L 31/1884* (2013.01)

(58) Field of Classification Search
CPC ............. H01L 31/1884; H01L 31/0322; H01L 31/022475; H01L 31/1864
See application file for complete search history.

(56) References Cited

OTHER PUBLICATIONS

Liu ("Template-assisted synthesis of hollow TiO2@rGO core-shell structural nanospheres with enhanced photocatalytic activity") (Year: 2015).*

Han ("High-performance perovskite/Cu(In,Ga)Se2 monolithic tandem solar cells") (Year: 2018).*

Bush ("Thermal and Environmental Stability of Semi-Transparent Perovskite Solar Cells for Tandems Enabled by a Solution-Processed Nanoparticle Buffer Layer and Sputtered ITO Electrode") (Year: 2016).*

Abd. Rashid Bin Mohd Yusoff et al. "Extremely stable all solution processed organic tandem solar cells with TiO2/GO recombination layer under continuous light illumination".Nanoscale. Sep. 6, 2013, vol. 5, pp. 11051-11057. DOI: 10.1039/c3nr03068g, pp. 11051, 1152.

Asim Guchhait et al. "Over 20 percent Efficient CIGS-Perovskite Tandem Solar Cells". ACS Energy lett. Mar. 9, 2017, vol. 2, No. 4, pp. 807-812. DOI: 10.1021/acsenergylett.7b00187, pp. 807-810.

Gill Sang Han et al. Reduced Graphene Oxide/Mesoporous TiO2 Nanocomposite Based Perovskite Solar Cells. ACS Appl. Mater. Interfaces. Oct. 7, 2015, vol. 7, No. 42, pp. 23521-23526. DOI: 10.1021/acsami.5b06171, pp. 23521-23525.

Nhu Thuy Ho et al. Enhancement of recombination process using silver and graphene quantum dot embedded intermediate layer for efficient organic tandem cells.Scientific Reports. Jul. 25, 2016, vol. 6, No. 30327, pp. 1-8. DOI: 10.1038/srep30327, pp. 1-7.

* cited by examiner

INTEGRATED TANDEM SOLAR CELL AND MANUFACTURING METHOD THEREOF

CROSS-REFERENCE TO RELATED APPLICATION

This application claims priority to and the benefit of Korean Patent Application No. 2019-0154193, filed on Nov. 27, 2019, the disclosure of which is incorporated herein by reference in its entirety.

BACKGROUND

1. Field of the Invention

The present invention relates to an integrated tandem solar cell including a recombination layer having a nanoparticle layer, and more particularly, to an integrated tandem solar cell, which includes a recombination layer having a triple layer structure in which a nanoparticle layer is disposed as an intermediate layer and employs the recombination layer as a junction portion, and a method of manufacturing the same.

2. Discussion of Related Art

Tandem solar cell has been an attempt to minimize thermalization loss by vertically stacking light absorption layers having different bandgaps to effectively use solar energy in a wide wavelength range. Specifically, tandem solar cells may overcome an efficiency limit (Shockley-Queisser limit) of single junction solar cells by allowing light absorption layers having different bandgaps to absorb sunlight in a complementary way with the principle of minimizing the loss of extra energy of electrons-holes to the form of thermal energy, wherein the extra energy is generated when photons having an energy larger than a bandgap of the single-junction solar cell are absorbed in a light absorption layer. Recently, with increasing interest in the tandem solar cells as the most feasible next-generation solar cells, competition for research and development to preemptively secure a tandem solar cell technology of various structures is intensifying worldwide.

In the early stage of tandem solar cell research, research and development of Group III-V semiconductor-based and amorphous/polycrystalline silicon-based tandem solar cells had been actively carried out. In the case of the Group III-V semiconductor-based tandem solar cells, researchers at Spectrolab in the United States reported a quintuple-junction solar cell with photo conversion efficiency of 38.8% in 2014. However, since a deposition technique of an epi-layer is complicated and a manufacturing cost is high due to the use of expensive equipment, its applicability is extremely limited to a spacecraft or the like. Meanwhile, the amorphous/crystalline silicon-based tandem solar cell is relatively competitive in price but has a low probability of commercialization due to its efficiency still being low (National Institute of Advanced Industrial Science and Technology in Japan reported efficiency of a triple junction solar cell of 14% in 2016).

Recently, research on tandem solar cells has been mainly focused on utilizing a perovskite solar cell, which has a high photo conversion efficiency of 25.2%, as an upper cell. Since the perovskite solar cell has advantages of exhibiting excellent photoelectric properties, such as tunable bandgap, and being manufactured by a low temperature solution process, research on "tandemization" of perovskite solar cells with a silicon solar cell having a bandgap ranging from 1.0 eV to 1.1 eV or a thin film solar cell (a chalcogenide series including chalcopyrite and kesterite) is intensifying worldwide. Research on the tandemization with the silicon solar cell has rapidly risen as a viable alternative capable of bringing about a significant change in the existing market by overcoming a limitation on silicon solar cell efficiency without significantly increasing the manufacturing cost of a single-junction silicon solar cell which currently dominates the solar cell market. The Oxford PV in the United Kingdom reported a silicon/perovskite monolithic tandem solar cell having efficiency of 28% in 2019, is conducting research and development aiming for commercialization in 2020, and is recently known to be attracting large-scale investment.

Meanwhile, although tandemization of thin film solar cell/perovskite solar cell can take advantage of a light and flexible thin film solar cell to lead to significant application expansion, a development speed of this tandemized structure is relatively slower than that of research on a silicon-based tandem solar cell. A light absorption layer of a chalcogenide-based thin film solar cell is manufactured through various manufacturing methods such as a co-evaporation method, a sputtering method, an electrochemical deposition method, a solution method, or the like, and a surface of the formed thin film usually exhibits a very rough characteristic due to the nature of a material and a manufacturing process. Surface roughness of the light absorption layer is directly transferred to surface roughness of layers which are sequentially formed on the light absorption layer, including an n-type buffer layer, a zinc oxide (ZnO) layer which is an intrinsic semiconductor, and a transparent conductive oxide layer. Meanwhile, an upper perovskite cell is formed of several layers having thicknesses ranging from tens to hundreds of nanometers. When perovskite is manufactured as an upper cell of an integrated tandem solar cell based on a solution process, the formation of a uniform film may be difficult according to surface r a lower cell. This causes degradation in fill factor and the like, resulting in degradation in efficiency of an integrated tandem solar cell. That is, in order to successfully implement a low cost and thin film integrated tandem solar cell based on a solution process, it is important to control surface morphology of a junction portion between two sub-cells (the upper cell and the lower cell).

Recently, research has been carried out to solve the above problem with various approaches. Researchers at UCLA in the United States reported that a surface of a recombination layer (or a tunnel junction) was planarized by chemical mechanical polishing (CMP) so that an integrated copper indium gallium selenide (CIGS)/perovskite tandem solar cell having high efficiency of 22.4% was obtained. However, the above manufacturing method of a tandem solar cell, which includes a CMP process, may be not suitable for commercialization in terms of economic feasibility or mass production.

SUMMARY OF THE INVENTION

The present invention is directed to a monolithic (or integrated) tandem solar cell in which a first solar cell (a lower cell) in the form of a thin film solar cell and a second solar cell (a upper cell) in the form of a perovskite solar cell are stacked in series and in which absorption of a lower cell in long-wavelength range is improved as well as a characteristic of a charge transfer or recombination in a junction portion is improved by controlling surface morphology of the junction portion using a method of flattening surface roughness of the junction portion between two cells and improving long wavelength transmittance of a recombination layer.

The present invention is directed to an integrated tandem solar cell including the recombination layer and a method of manufacturing the same.

The technical problems to be solved by the present invention are not limited to the above-mentioned technical problems and other technical problems which are not mentioned can be clearly understood by those skilled in the art to which the present invention pertains from the following description.

According to an aspect of the present invention, there is provided an integrated tandem solar cell including a first solar cell having a form in which a rear electrode, a light absorption layer, and a buffer layer are stacked, a recombination layer formed on the buffer layer and including a triple layer structure which has a first transparent conductive layer and a second transparent conductive layer with a transparent conductive nanoparticle layer disposed therebetween, and a second solar cell disposed on and bonded to the recombination layer and including a perovskite layer.

The first solar cell may have a structure of a thin film solar cell containing copper indium gallium selenide (CIGS) and copper indium selenide (CIS) of a chalcopyrite series or copper zinc tin sulfide (CZTS) of a kesterite series.

The transparent conductive nanoparticle layer may be formed of indium tin oxide, aluminum zinc oxide, zirconium tin oxide or a compound of indium and zinc oxide, which is in a form of nanoparticles selected from a transparent conductive oxide material composed of multicomponents containing indium, tin, zinc, and the like.

The transparent conductive nanoparticle layer may be formed of core-shell type silica ($SiO_2$@rGO) nanoparticles coated with reduced graphene oxide or titanium dioxide ($TiO_2$@ rGO) nanoparticles coated with reduced graphene oxide.

The integrated tandem solar cell may further include ethyleneglycol or polyvinylpyridine which serves as a bridge of a charge transfer between nanoparticles.

The first transparent conductive layer may be an intrinsic zinc oxide layer, and the second transparent conductive layer may be formed of indium tin oxide, aluminum zinc oxide, zirconium tin oxide, or a compound of indium oxide and zinc oxide, which is selected from a high-transmittance high-conductivity oxide material composed of multicomponents containing indium, tin, zinc, and the like.

A thickness of the transparent conductive nanoparticle layer may range from 70 nm to 100 nm. When the thickness of the transparent conductive nanoparticle layer is less than 70 nm, the surface roughness of the CIS sub-cell cannot be decreased, and, when the thickness of the transparent conductive nanoparticle layer is greater than or equal to 100 nm, it may cause a loss of transmittance and an increase of resistance.

A thickness of the first transparent conductive layer may range from 10 nm to 800 nm, and more preferably, from 30 nm to 200 nm. When the thickness of the first transparent conductive layer is less than 30 nm, it may be difficult to form a uniform film, and, when the thickness of the first transparent conductive layer is greater than or equal to 200 nm, it may cause a loss of transmittance due to an increase of parasitic absorption.

A thickness of the second transparent conductive layer may range from 30 nm to 100 nm, and more preferably, from 40 nm to 60 nm. When the thickness of the second transparent conductive layer is less than 40 nm, it may cause damage to the buffer layer disposed below the second transparent conductive layer when the AZO nanoparticle dispersion solution is applied, and, when the thickness of the second transparent conductive layer is greater than or equal to 60 nm, it may cause a loss of transmittance and an increase of resistance.

According to another aspect of the present invention, there is provided a method of manufacturing an integrated tandem solar cell, which includes forming a first solar cell having a form in which a rear electrode, a light absorption layer, and a buffer layer are stacked, forming a recombination layer formed on the buffer layer and including a triple layer structure which has a first transparent conductive layer and a second transparent conductive layer with a transparent conductive nanoparticle layer disposed therebetween, and forming a second solar cell disposed on and bonded to the recombination layer and including a perovskite layer.

The transparent conductive nanoparticle layer may be formed by a spin coating, dip coating, spray coating (spraying), electrospraying, or successive ionic layer adsorption and reaction (SILAR) method.

The method may further include modifying a surface of the transparent conductive nanoparticle layer through additional heat treatment and ultraviolet (UV)-ozone treatment.

The second solar cell may be an inverted perovskite solar cell formed of a p-type hole selective layer (or p-type hole transport layer)/perovskite/n-type electron selective layer (or n-type electron transport layer)/front transparent electrode/metal grid electrode.

The second solar cell may further include a conductive oxide protection layer between the n-type electron selection layer and the front transparent electrode. The conductive oxide protection layer may be selected from the group consisting of zinc oxide and titanium dioxide.

The p-type hole selective layer may be a single layer made of poly(3,4-ethylenediox-ythiophene) polystyrenesulfonate (PEDOT:PSS) of the conductive polymer series, poly(bis(4-phenyl)(2,4,6-trimethylphenyl)amine) (PTAA), polyvinyl alcohol (PVA), crosslinked N4,N4'-bis(4-(6-((3-ethyl-oxetan-3-yl)methoxy)hexyl)phenyl)-N4,N4'-diphenylbiphe-nyl-4,4'-diamine (c-OTPD), poly(N-9'-heptadecanyl-2,7-carbazole-alt-5,5-(4',7'-di-2-thienyl-2',1',3'-benzothiadiazole (PCDTBT), or PTAA doped with 2,3,5,6-tetrafluoro-7,7,8,8-tetracyanoquinodi-methaneF4-T (CNQ) or may be a double layer made of PEDOT:PSS and poly[N, N'-bis(4-butylphenyl)-N, N'-bis(phenyl)benzidine] (poly-TPD) or PEDOT:PSS and PCDTBT.

The manufacturing process of the p-type hole selective layer may further include a thin film modification process for improving a hole transport characteristic by heat treatment at a temperature ranging from 100° C. to 120° C.

The perovskite layer may be formed of a composite material in which materials are combined, wherein the materials are included in two or more groups selected from the group consisting of a carbon compound group including methyl ammonium (MA) ($CH_3NH_3^+$) and formamidinium (FA) ($HC(NH_2)_2^+$), a metal group including cesium, rubidium, lead, and tin, and a halogenated group including iodide and chloride and may be manufactured by a one-step or two-step solution process, a vacuum process, and a mixing process.

The n-type electron selective layer may be formed of any one of [6,6]-phenyl-C 61-butyric acid methyl ester (PCBM), C60, or a combination thereof, which is selected from the group of fullerene derivatives and may further include an organic buffer layer formed of amphiphilic block copolymer (BCP), PFN, LiF, or PEIE.

The front transparent electrode may be formed of one or more oxides among indium, tin, and zinc, formed of any one among zinc aluminum oxide, zinc oxide, and indium hydride oxide, formed of a single layer made of one material selected from the group consisting of oxide-based nanoparticles, a silver nanowire, a carbon nanotube, graphene, and PEDOT: PSS, a multiple layer in which each of two or more materials forms a layer, or a composite layer having a form in which two or more materials are randomly mixed.

The metal grid electrode may be formed of any one selected from the group consisting of silver, gold, aluminum, and nickel or a combination of two or more selected therefrom.

BRIEF DESCRIPTION OF THE DRAWINGS

The patent or application file contains at least one drawing executed in color. Copies of this patent or patent application publication with color drawings will be provided by the Office upon request and payment of the necessary fee.

The above and other objects, features and advantages of the present invention will become more apparent to those skilled in the art by describing exemplary embodiments thereof in detail with reference to the accompanying drawings, in which.

DETAILED DESCRIPTION OF EXEMPLARY EMBODIMENTS

Figure 1:
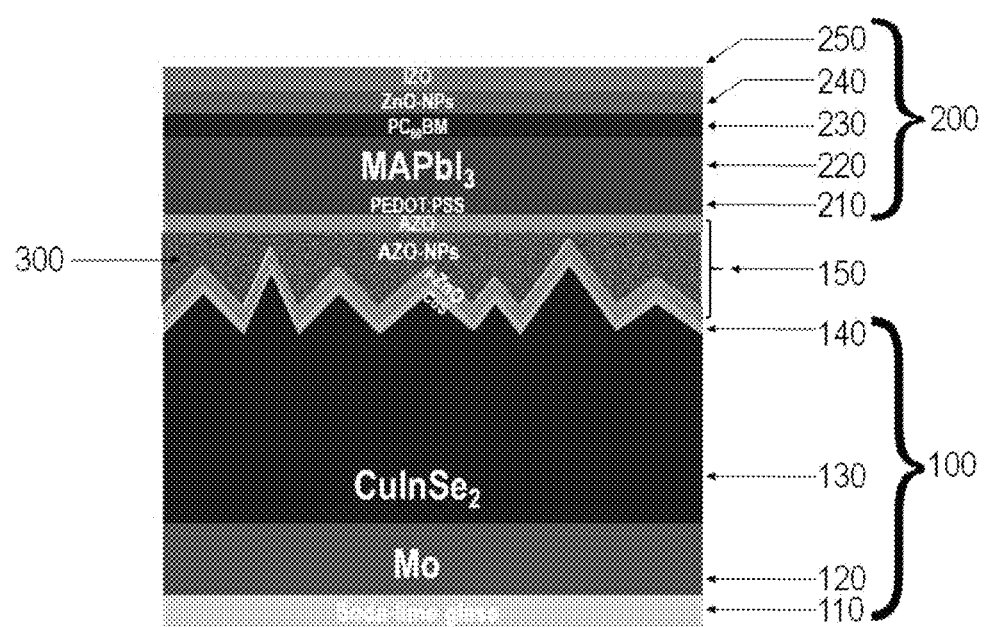
FIG. 1 is a schematic diagram illustrating a configuration of an integrated tandem solar cell employing a recombination layer having a nanoparticle layer as a junction portion according to one embodiment of the present invention.

Hereinafter, the present invention will be described in detail with reference to the accompanying drawings. However, the present invention may be implemented in various different forms, and thus it is not limited to exemplary embodiments which will be described herein. Further, the accompanying drawings are merely intended to facilitate understanding of embodiments disclosed herein, and the technical spirit disclosed herein is not limited by the accompanying drawings, and it should be understood that all modifications, equivalents, and substitutes fall within the spirit and scope of the present invention. In order to clearly describe the present invention, portions not related to the description are omitted, and a size, a form, and a shape of each component shown in the drawings may be variously modified, and throughout this disclosure, the same and similar reference numerals are assigned to the same and similar parts.

Suffixes "cell," "operation," and "process" for components used in the following description are given or interchanged in consideration of only ease of description, and thus these suffixes do not have distinctive meanings or functions. Further, in the following description of the embodiments disclosed herein, when a detailed description of a known related art is determined to obscure the gist of the embodiments disclosed herein, the detailed description thereof will be omitted here.

Throughout this disclosure, when a part is referred to as being "linked, connected, contacted, coupled, or stacked" to another part, this includes a case in which the part is "directly linked, connected, contacted, coupled, or stacked" to another part as well as a case in which the part is "indirectly linked, connected, contacted, coupled, or stacked" to another part by interposing still another member between the part and another part. Further, when a part is referred to as "including (having or providing with)" a component, this refers to that the part can further include (has or is provided with) other elements, not excluding other elements unless specifically stated otherwise.

Also, the terms including ordinal numbers such as first, second, and the like used herein may be used to describe various components, but the various components are not limited by the terms. The terms are used only for the purpose of distinguishing one component from another component. For example, without departing from the scope of the present invention, a first component may be referred to as a second component, and similarly, a second component may also be referred to as a first component.

The terms used herein are for the purpose of describing only specific embodiments and are not intended to limit the present invention. The singular form includes the plural form unless the context clearly dictates otherwise, and components which are distributed and implemented may be embodied in a combined form unless otherwise specified. In this disclosure, the terms "comprising," "having," and the like are used to specify that a feature, a number, a step, an operation, a component, an element, or a combination thereof described herein exists, and they do not preclude the presence or addition of one or more other features, numbers, steps, operations, components, elements, or combinations thereof.

FIG. 1 is a schematic diagram illustrating a configuration of an integrated tandem solar cell according to one embodiment of the present invention. The integrated tandem solar cell includes a first solar cell 100 for forming a lower portion of the integrated tandem solar cell, a second solar cell 200 stacked on the first solar cell 100 to form an upper portion of the integrated tandem solar cell, and a recombination layer 150 (or a junction layer or a junction portion) formed between the first solar cell 100 and the second solar cell 200. Detailed components shown in the drawing are shown by way of example.

The first solar cell 100 may be formed such that a rear electrode 120, a light absorption layer 130, and an n-type buffer layer 140 are sequentially stacked on a substrate 110 and may be in the form of a thin film solar cell without a front electrode.

The recombination layer 150 may be a tunnel junction layer or a junction layer, may be formed on the n-type buffer layer 140 of the first solar cell 100, and may be a layer for tandemly bonding the first solar cell 100 to the second solar cell 200.

The recombination layer 150 may be formed of a triple layer in which an intrinsic zinc oxide (ZnO) layer (an upper portion of a buffer layer), a nanoparticle layer 300 having transparency and conductivity, and a transparent conductive layer having transparency and conductivity are sequentially stacked.

The nanoparticle layer 300 constituting the recombination layer 150 is formed of nanoparticles having sizes ranging from 1 to 20 nm. The nanoparticle may include indium tin oxide, aluminum zinc oxide, zirconium tin oxide, or a compound of indium and zinc oxide, which is selected from highly transparent conductive oxide material consisting of multicomponents including indium (In), tin (Sn), zinc (Zn), and the like, may include a silica ($SiO_2$@rGO) nanoparticle coated with reduced graphene oxide in the form of a core-shell or a titanium dioxide ($TiO_2$@rGO) nanoparticle coated with reduced graphene oxide, or may include ethyleneglycol or polyvinylpyridine which is capable of serving as a bridge between the nanoparticles.

Further, the transparent conductive layer in the recombination layer 150 may be formed of one or more oxides among In, Sn, and Zn, for example, may be formed of indium tin oxide, indium zinc oxide, zinc tin oxide or may be formed of aluminum zinc oxide, zinc boron oxide, indium hydride oxide, or zirconium tin oxide which includes aluminum, boron, hydrogen, or zirconium.

Further, the intrinsic zinc oxide layer and the transparent conductive layer included in the recombination layer 150 may be formed through a sputtering method, an electron beam evaporation method, or the like.

The second solar cell 200 may include a perovskite layer, may be bonded on the recombination layer 150, and may be formed in the form of a perovskite solar cell without a rear electrode.

Further, the second solar cell 200 may have a form in which a p-type hole selective layer 210, a perovskite layer 220, an n-type electron selective layer 230, a front transparent electrode 250, and a metal grid electrode (not shown) are sequentially stacked.

Further, the second solar cell 200 may further include an oxide protection layer 240 made of a mixture among zinc oxide (ZnO), titanium dioxide, zirconium oxide ($ZrO_2$), aluminum doped zinc oxide (Al-doped ZnO), tin oxide ($SnO_2$), indium oxide ($In_2O_3$), zinc tin oxide, niobium-based oxide ($Nb_2O_5$), barium titanate ($BaTiO_3$), strontium titanate ($SrTiO_3$), and tungsten oxide-titanium dioxide ($WO_x$—$TiO_x$) between the n-type electron selective layer 230 and the front transparent electrode 250.

The perovskite layer 220 constituting the second solar cell 200 may be formed of a composite material in which materials are combined, wherein the materials are included in two or more groups selected from the group consisting of a carbon compound group including methyl ammonium (MA) ($CH_3NH_3^+$) and formamidinium (FA) ($HC(NH_2)_2^+$), a metal group including cesium, rubidium, lead, and tin, and a halogenated group including iodide and chloride, but the present invention is not limited thereto. Further, the perovskite layer 220 may be manufactured by a solution process, a vacuum process, or a mixing process, but the present invention is not limited thereto.

Further, the p-type hole selective layer 210 of the second solar cell may be a single layer made of poly(3,4-ethylene-diox-ythiophene) polystyrenesulfonate (PEDOT:PSS) of the conductive polymer series, poly(bis(4-phenyl)(2,4,6-trimethylphenyl)amine) (PTAA), polyvinyl alcohol (PVA), crosslinked N4,N4'-bis(4-(6-((3-ethyloxetan-3-yl)methoxy)hexyl)phenyl)-N4,N4'-diphenylbiphenyl-4,4'-diamine (c-OTPD), poly(N-9'-heptadecanyl-2,7-carbazole-alt-5,5-(4',7'-di-2-thienyl-2',1',3'-benzothiadiazole (PCDTBT), or PTAA doped with 2,3,5,6-tetrafluoro-7,7,8,8-tetracyanoqui-nodi-methaneF4-T (CNQ) or may be a double layer made of PEDOT:PSS and poly[N,N'-bis(4-butylphenyl)-N, N'-bis(phenyl)benzidine] (poly-TPD) or PEDOT:PSS and PCDTBT.

Further, the n-type electron selective layer 230 of the second solar cell may be formed of any one of [6,6]-phenyl-C 61-butyric acid methyl ester (PCBM) and C60 or a combination thereof but may also be formed of other materials. Further, the n-type electron selective layer 230 may further include an organic material layer formed of amphiphilic block copolymer (BCP), PFN, LiF, or PEIE.

Similar to the recombination layer 150, the front transparent electrode 250 may also be formed of one or more oxides among In, Sn, and Zn, for example, indium tin oxide, indium zinc oxide, or zinc tin oxide, formed of aluminum zinc oxide, zinc boron oxide, or indium hydride oxide, including aluminum, boron, and hydrogen, or formed of one layer selected from the group consisting of the oxide-based nanoparticle, a silver nanowire, a carbon nanotube, graphene, and PEDOT:PSS or two or more composite layers selected therefrom.

Hereinafter, an effect of the integrated tandem solar cell according to the present invention will be described in detail through Experimental Example with respect to an illustrative model of the integrated tandem solar cell manufactured according to one embodiment of the present invention and Comparative Example to be compared with Experimental Example with reference to FIGS. 2A to 7.

Experimental Example

In Experimental Example for manufacturing an integrated tandem solar cell employing a recombination layer having a nanoparticle layer according to various embodiments of the present invention as a junction portion, a lower cell (a first solar cell) in the form of a copper indium selenide (CIS) thin film solar cell was provided, a recombination layer including a nanoparticle layer was formed on an n-type buffer layer of the first solar cell, and an upper cell (a second solar cell) in the form of a perovskite solar cell was stacked on the recombination layer.

Here, the first solar cell in the form of the CIS thin film solar cell included a soda lime glass, a rear electrode, a light absorption layer, and a buffer layer. The light absorption layer of the first solar cell was a p-type CIS-based inorganic thin film and was manufactured using a three-electrode electrochemical deposition method (hereinafter referred to as electrodeposition), a molybdenum deposited soda lime glass, a silver-silver chloride electrode (Ag/AgCl), and platinum (Pt) were used as a working electrode, a reference electrode, and a counter electrode.

Electrodeposition was performed in a single bath. A solution was prepared by dissolving 0.24 M potassium chloride, 2.4 mM copper chloride dehydrate, 9.6 mM indium chloride, 5.2 mM selenium dioxide, 12 mM sulfamic acid, and 12 mM potassium hydrogenphthalate in 120 ml distilled water. After the electrodes were immersed in the prepared solution, a thin film was formed by applying a voltage of −0.54 V for 5400 seconds by a potentiostatic method using a PARSTAT MC POTENTIOSTAT of AMETEK, Inc.

The CIS-based thin film formed by electrodeposition was loaded in a tube furnace and sintered at a temperature of 580° C. for 30 minutes. During the above process, heat treatment was performed in a selenium (Se) atmosphere formed by heating Se pellets, and argon gas was used as a carrier gas and adjusted at a flow rate of 100 sccm.

In order to complement differences in bandgap and lattice constant between a p-type CIS-based light absorption layer material and an n-type recombination layer material and prevent damage to the light absorption layer due to sputtering deposition of the recombination layer, cadmium sulfide (CdS) serving as the buffer layer was formed by chemical bath deposition (CBD). The sintered CIS-based thin film was immersed in a solution containing 2 mM cadmium sulfate, 1.02 M ammonia water, and 84 mM thiourea and then a CBD process was performed at a temperature of 60° C. for about 13 minutes.

When intrinsic ZnO (i-ZnO), which is an intrinsic semiconductor oxide and aluminum-doped ZnO (Al:ZnO) (AZO) transparent conductive layer, were sequentially stacked by sputtering to form the recombination layer on the thin film to which the process of forming the buffer layer was completed, an AZO nanoparticle layer was further disposed between the i-ZnO film and the AZO film to form the recombination layer having a triple layer structure.

The AZO nanoparticle layer was a layer introduced to planarize a junction portion between two sub-cells, more specifically, to flatten surface roughness of the AZO transparent conductive layer adjacent to a hole selective layer, which is a first component of the upper cell, to improve long-wavelength transmittance of the recombination layer, and to improve characteristics of a charge transfer or recombination in the junction portion. The AZO nanoparticle layer was formed by spin-coating on the i-ZnO film with a 12 nm-sized AZO nanoparticle dispersion solution dispersed in isopropanol.

In this case, a surface of the i-ZnO film was ultraviolet (UV)-ozone treated for 20 minutes so as to improve a wetting characteristic of the AZO nanoparticle dispersion solution by allowing the surface of the i-ZnO film to exhibit a hydrophilic characteristic.

The AZO nanoparticle layer formed through spin coating should be thick enough for reducing the surface roughness of the CIS sub-cell and should be thin enough for minimizing a loss of transmittance and an increase of resistance due to the introduction of an additional layer.

Further, the AZO nanoparticle layer should have a high packing density $\rho_r$ so as to facilitate a charge transfer in the junction portion of the integrated tandem solar cell.

Further, the AZO nanoparticle layer should have high long-wavelength transmittance so as to transmit a sufficient amount of light to the lower cell when being applied to the junction portion of the integrated tandem solar cell.

Further, the AZO nanoparticle layer should have an excellent recombination characteristic of electrons-holes transferred from each sub-cell so as to minimize an electrical loss in the junction portion of the integrated tandem solar cell.

Figure 2A:
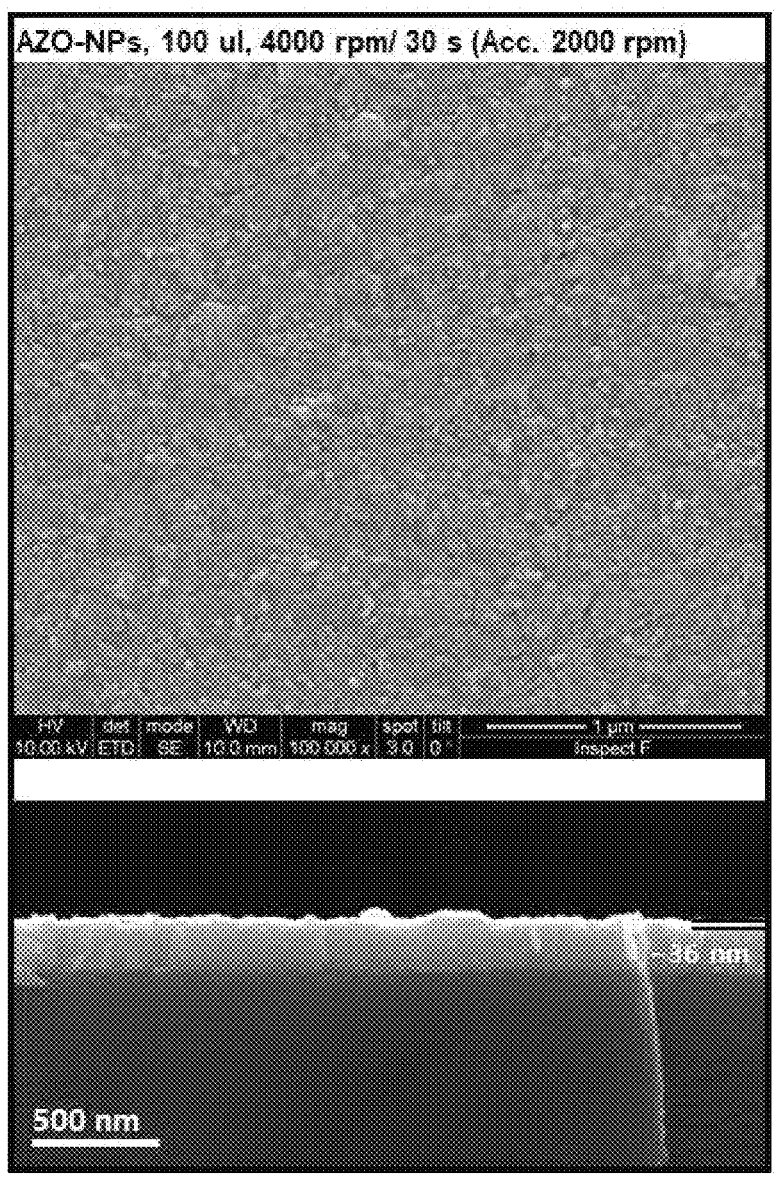
FIGS. 2A to 2C show scanning electron microscope (SEM) images of an aluminum zinc oxide (AZO) nanoparticle layer depending on a spin coating condition according to one embodiment of the present invention.
Figure 2B:
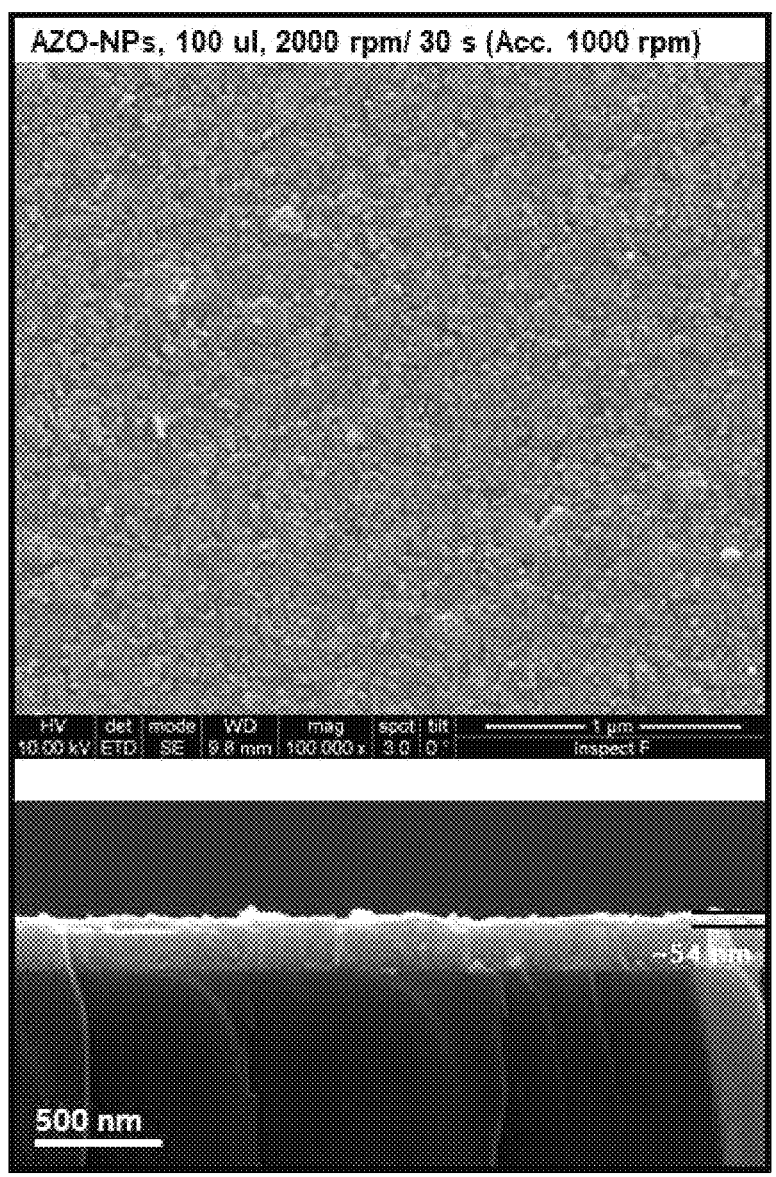
Figure 2C:
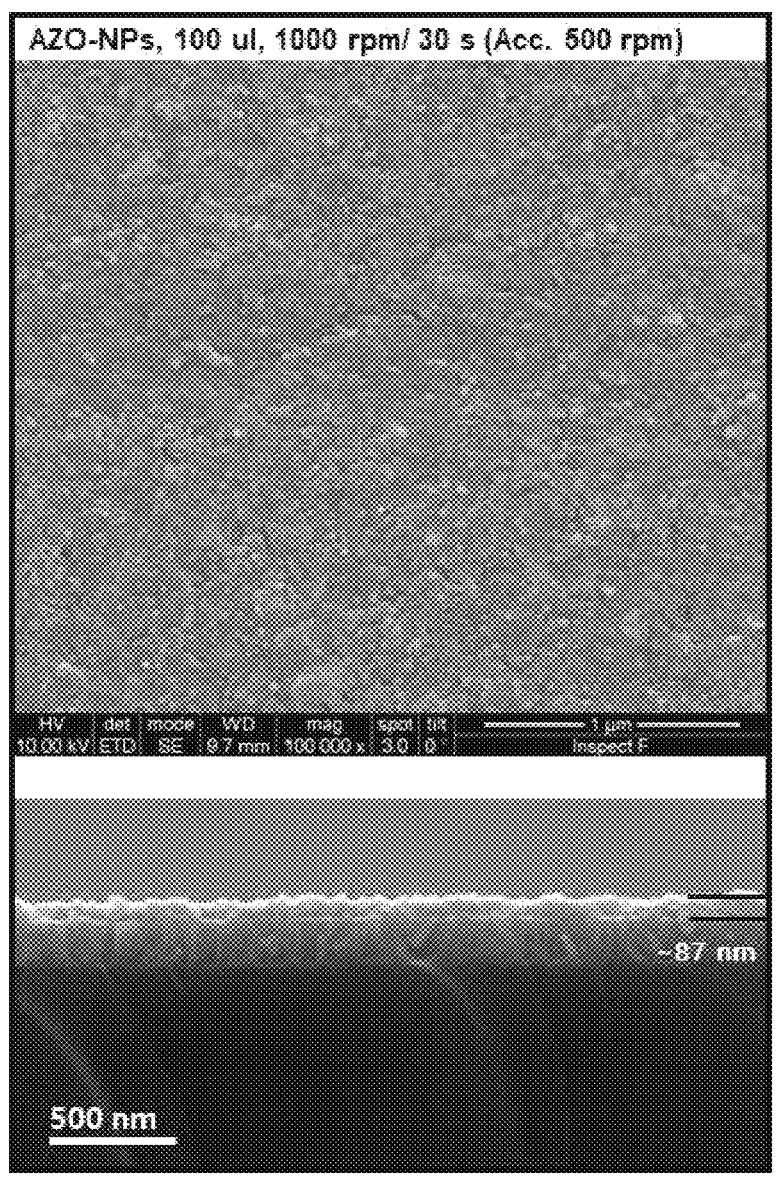
Figure 3:
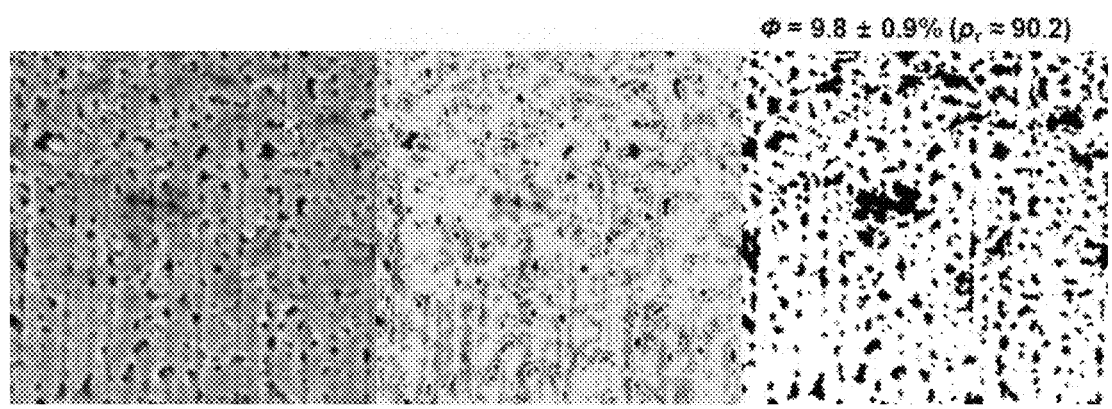
FIG. 3 shows images of analysis of a packing density of AZO nanoparticles according to one embodiment of the present invention.

In order to analyze in detail the characteristic of the AZO nanoparticle layer manufactured according to the present invention, the analysis of thickness and packing density was performed using SEM (field-emission (FE)-SEM or Inspect F), and the results were shown in FIGS. 2A to 3.

FIGS. 2A to 2C show SEM images of the AZO nanoparticle layer depending on a spin coating condition according to one embodiment of the present invention.

The coating process was performed at spin coating speeds of 1000, 2000, and 4000 revolutions per minute (RPM) to adjust a thickness of the AZO nanoparticle layer, and a surface morphology and a thickness of the AZO nanoparticle layer according to the spin coating speed were observed using SEM. Referring to FIGS. 2A to 2C, it can be seen that, as the spin coating speed decreased from 4000 RPM to 2000 RPM and 1000 RPM, the thickness of the AZO nanoparticle layer was increased from 36 nm to 54 nm and 87 nm, and, when the spin coating speed was as fast as 4000 RPM, it can be seen that a uniform film is not formed.

When the AZO nanoparticle layer is applied to the junction portions of a thin film solar cell and a perovskite integrated tandem solar cell for the purpose of planarization of the lower cell, the thickness of the AZO nanoparticle layer may range from 30 nm to 200 nm, more preferably, from 70 nm to 100 nm. When the thickness of the AZO nanoparticle layer is less than 70 nm, the surface roughness of the CIS sub-cell cannot be reduced, and, when the thickness of the AZO nanoparticle layer is greater than or equal to 100 nm, it may cause a loss of transmittance and an increase of resistance. That is, in Experimental Example, in consideration of the surface roughness of the CIS lower cell ranging from 46 nm to 52 nm, the thickness of the AZO nanoparticle layer preferably ranges from 70 nm to 100 nm, and it can be seen that the thickness of the AZO nanoparticle layer in that range was formed in a condition of the spin coating speed of 1000 RPM.

A thickness of the i-ZnO transparent conductive layer may range from 30 nm to 100 nm, and more preferably, from 40 nm to 60 nm. When the thickness of the i-ZnO transparent conductive layer is less than 40 nm, it may cause damage to the buffer layer disposed below the i-ZnO transparent conductive layer when the AZO nanoparticle dispersion solution is applied, and, when the thickness of the i-ZnO transparent conductive layer is greater than or equal to 60 nm, it may cause a loss of transmittance and an increase of resistance.

A thickness of the AZO transparent conductive layer may range from 10 nm to 800 nm, and more preferably, from 30 nm to 200 nm. When the thickness of the AZO transparent conductive layer is less than 30 nm, it may be difficult to form a uniform film, and, when the thickness of the AZO transparent conductive layer is greater than or equal to 200 nm, it may cause a loss of transmittance due to an increase of parasitic absorption.

A packing density of the nanoparticle layer is related to the charge transfer in the recombination layer. When the packing density of the nanoparticle layer is low ($\rho_r$<80), it may be difficult for charges reaching the recombination layer to move easily between nanoparticles. Thus, the packing density of the AZO nanoparticle layer according to the present invention was analyzed, and the result thereof was shown in FIG. 3. FIG. 3 shows images of analysis of a packing density of AZO nanoparticles according to one embodiment of the present invention.

Referring to FIG. 3, since the packing density of the nanoparticle layer was $\rho_r \approx 90.2$, it can be seen that the packing density was sufficiently high for transferring charges smoothly.

Figure 4:
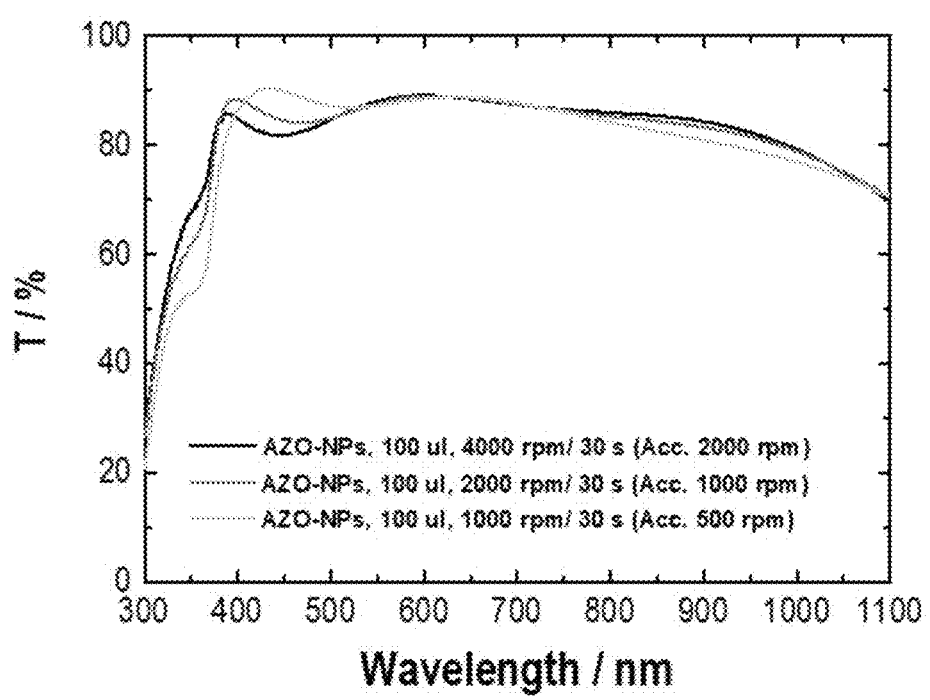
FIG. 4 is a graph showing transmittance of the AZO nanoparticle layer depending on a spin coating condition according to one embodiment of the present invention.

In order to confirm a light transmittance characteristic of the AZO nanoparticle layer according to each spin coating condition, light transmittance was measured using a UV-visible spectrometer, and the results were shown in FIG. 4. FIG. 4 is a graph showing transmittance of the AZO nanoparticle layer depending on a spin coating condition according to one embodiment of the present invention. When the thickness of the AZO nanoparticle layer ranges from 30 nm to 100 nm, it can be seen that a transmittance loss is not large.

Figure 5:
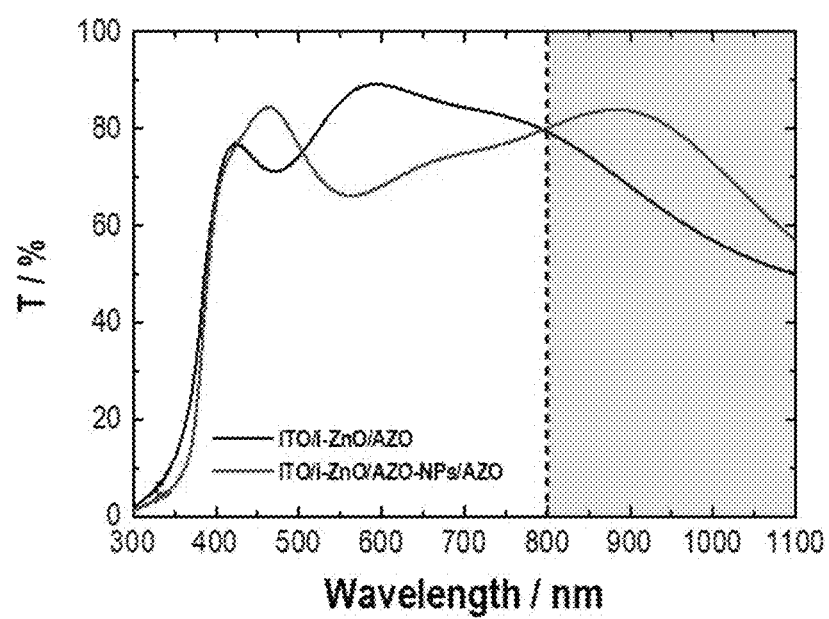
FIG. 5 is a light transmittance graph of recombination layers in a case in which the AZO nanoparticle layer according to one embodiment of the present invention is included and in a case in which the AZO nanoparticle layer is not included.

FIG. 5 is a light transmittance graph of recombination layers in a case in which the AZO nanoparticle layer according to one embodiment of the present invention is included and in a case in which the AZO nanoparticle layer is not included. As shown in FIG. 5, referring to the light transmittance characteristics of the recombination layer (i-ZnO/AZO nanoparticles/AZO) including the AZO nanoparticle layer and the recombination layer (i-ZnO/AZO) not including the AZO nanoparticle layer, it can be seen that the recombination layer including the AZO nanoparticle layer exhibited excellent light transmittance in the long wavelength range (from 800 nm to 1100 nm). In particular, high transmittance of 83% or more was exhibited in the vicinity of 900 nm, which is within a wavelength range in which the lower cell maximally absorbs the long wavelength sunlight. This means that a greater amount of light may be transmitted to the lower cell so that a photocurrent production of the lower cell may be improved.

A process of forming the second solar cell in the form of a perovskite solar cell was carried out by employing the recombination layer containing AZO nanoparticles as the junction portion, and the hole selective layer, a perovskite light absorption layer, an electron selective layer, an oxide protection layer, a front transparent electrode, and a metal grid were sequentially formed and stacked. The hole selective layer was formed such that PEDOT:PSS (Clevios™ P VP AI 4083) of Heraeus Holding was diluted in methanol at a volume ratio of 1:2, then spin-coating was performed therewith at 4000 RPM to form a thin film, and the thin film was thermally treated at a temperature of 120° C. for 5 minutes. A temperature and heat treatment time that are lower than a conventional heat treatment temperature and heat treatment time of PEDOT:PSS were applied. This is to prevent thermal damage to a p-n junction of the first solar cell in the form of the CIS thin film solar cell.

In order to form the perovskite light absorption layer, a solution was prepared by dissolving 44 wt % of methyl ammonium iodide ($CH_3NH_3I$) and lead iodide ($PbI_2$) in a mixed solvent of gamma-butyrolactone and dimethyl sulfoxide, and then methylammonium lead iodide ($CH_3NH_3PbI_3$) (hereafter referred to as $MAPbI_3$) was formed using a one-step spin coating process. The electron selective layer and the oxide protection layer were formed by sequentially spin-coating with PCBM and a ZnO nanoparticle dispersion solution dispersed in isopropanol. After, an indium zinc oxide (IZO) front transparent electrode was formed using a sputter, and then a silver grid electrode was deposited through a thermal deposition process.

Figure 6A:
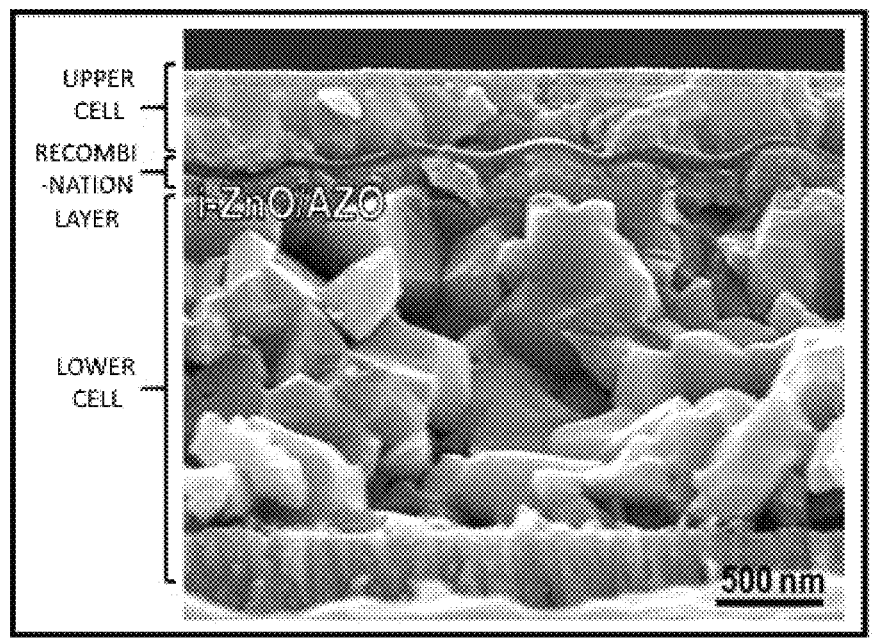
FIGS. 6A and 6B show SEM images illustrating structures of integrated tandem solar cells employing recombination layers as junction portions in a case in which the AZO nanoparticle layer according to one embodiment of the present invention is included and in a case in which the AZO nanoparticle layer is not included.
Figure 6B:
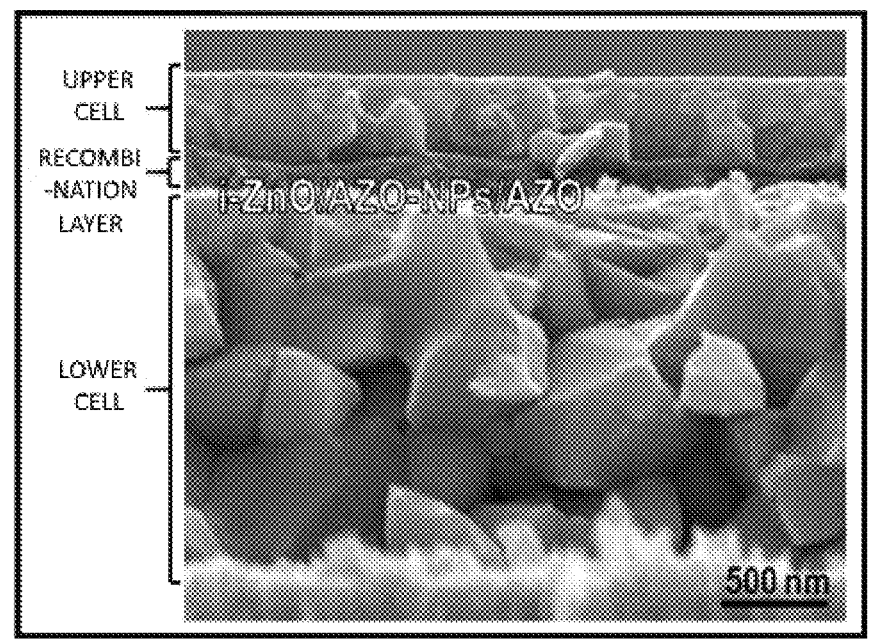

FIGS. 6A and 6B show SEM images illustrating structures of integrated tandem solar cells employing recombination layers as junction portions in a case in which the AZO nanoparticle layer according to one embodiment of the present invention is included and in a case in which the AZO nanoparticle layer is not included.

SEM was used to observe a cross-sectional structure of the integrated tandem solar cell employing the recombination layer having the AZO nanoparticle layer as the junction portion, and the result was shown in FIG. 6B. Referring to FIG. 6B, it can be seen that the surface flattening of the junction portion was made by introducing the AZO nanoparticle layer between the i-ZnO film and the AZO film according to the present invention to form a triple recombination layer. It can be seen that the second solar cell integratedly stacked on the first solar cell undergoing planarization through the AZO nanoparticle layer was uniformly deposited in all regions thereof.

Figure 7:
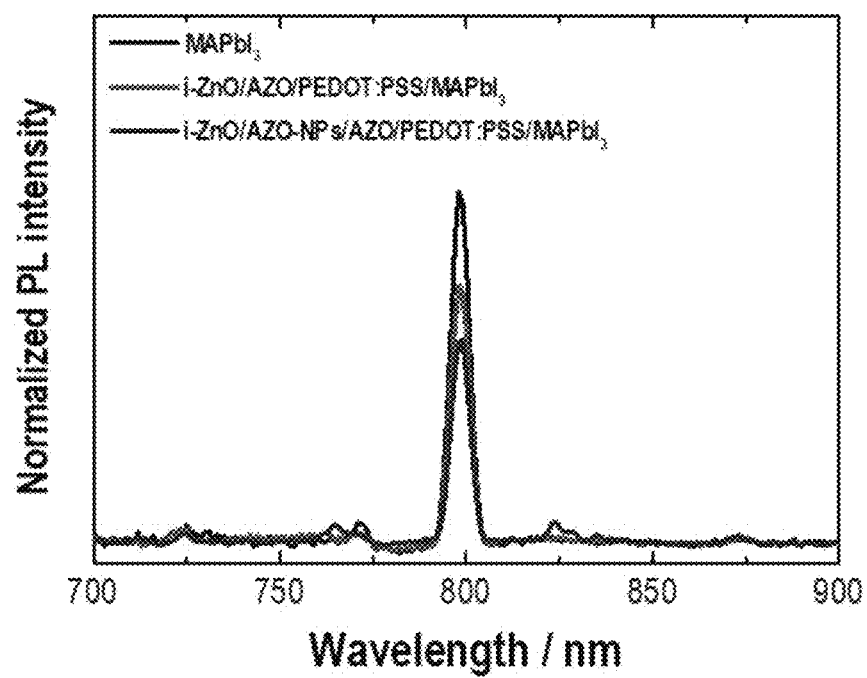
FIG. 7 is a photoluminescence graph showing recombination characteristics of recombination layers in a case in which the AZO nanoparticle layer according to one embodiment of the present invention is included and in a case in which the AZO nanoparticle layer is not included.

In order to investigate a recombination characteristic of the recombination layer having the AZO nanoparticle layer according to the present invention, photoluminescence (PL) spectra of the perovskite were measured, and the results were shown in FIG. 7. As the results of measuring the PL characteristics of the perovskite by forming the PEDOT:PSS, which is a hole transport layer, and the perovskite layer on the recombination layer having the AZO nanoparticle layer according to the present invention, it can be seen that PL strength of the recombination layer having the AZO nanoparticle layer was significantly reduced as compared with a case in which the AZO nanoparticle layer was not included. This means that holes and electrons excited in the perovskite were transferred faster to the recombination layer having the AZO nanoparticle layer to be better recombined before PL is exhibited. That is, the recombination characteristic of the recombination layer having the AZO nanoparticles is exhibited to be superior to the recombination layer not including AZO nanoparticles.

As can be seen from Experimental Example described above, according to the present invention, a surface roughness problem of the lower cell, which should be considered for achieving a high efficiency CIS/perovskite integrated tandem solar cell, is solved in a manner which improves the surface morphology of the junction portion by providing a new recombination layer including a nanoparticle layer by a spin coating method instead of costly processes such as chemical mechanical polishing and the like. Consequently, it is possible to minimize a shunt loss and provide an integrated tandem solar cell with an improved fill factor.

Further, according to the present invention, when the new recombination layer including the nanoparticle layer is introduced, absorption of long wavelength light which is within a main absorption range of the lower cell is improved due to an increase in long wavelength light transmittance of the recombination layer so that it is possible to provide an integrated tandem solar cell with an improved photocurrent.

Further, according to the present invention, when the new recombination layer including the nanoparticle layer is introduced, a charge transfer or recombination in a junction portion of two sub-cells is improved so that it is possible to provide a tandem solar cell with improved series resistance and an improved photovoltage.

Comparative Example

A first solar cell in the form of a CIS-based solar cell and a second solar cell in the form of a perovskite solar cell were manufactured in the same manner as in Experimental Example, and a recombination layer not including a nanoparticle layer was introduced into a junction portion.

In the same manner as in Experimental Example, a structural cross section of an integrated tandem solar cell of Comparative Example was observed, and the result was shown in FIG. 6A. Referring to FIGS. 6A and 6B, as compared with the tandem solar cell including the recombination layer having the nanoparticle layer according to Experimental Example, it can be seen that the tandem solar cell with a recombination layer not including nanoparticle layer had relatively uneven surface morphology in the junction portion, and a hole transport layer applied on this recombination layer on which planarization was not made was also unevenly deposited. As described above, an upper cell which is formed on the recombination layer having high surface roughness and is not uniformly formed may cause a shunt loss so that degradation in efficiency of the integrated tandem solar cell may occur.

In accordance with the present invention, since a recombination layer including a nanoparticle layer is formed in a junction portion between two sub-cells, it is possible to reduce surface roughness of the junction portion, and thus a shunt loss is reduced so that it is possible to provide an integrated tandem solar cell with an improved fill factor and the like.

Further, in accordance with the present invention, the recombination layer including the nanoparticle layer can improve long wavelength transmittance, and thus absorption of long wavelength light in a lower cell can be improved so that it is possible to provide a tandem solar cell with an improved photocurrent.

Further, in accordance with the present invention, the recombination layer including the nanoparticle layer can improve a characteristic in charge transfer or recombination in the junction portion between the two sub-cells so that it is possible to provide a tandem solar cell with improved series resistance and an improved photovoltage.

It should be understood that effects of the present invention are not limited to the above-described effects and include all effects that can be deduced from the detailed description of the present invention or the configuration thereof defined by the appended claims.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. An integrated tandem solar cell, comprising:
   a first solar cell including a rear electrode, a light absorption layer disposed on the rear electrode, and a buffer layer disposed on the light absorption layer;
   a recombination layer that is a triple layer structure including:
      a first transparent conductive layer that is transparent and conductive, and that is disposed on the buffer layer;
      a nanoparticle layer that is transparent and conductive, that is disposed on the first transparent conductive layer, that comprises nanoparticles, and that planarizes the first solar cell, wherein the nanoparticle layer has a thickness ranging from 70 nm to 100 nm and the nanoparticles have a size ranging from 1 nm to 20 nm, and wherein the nanoparticle layer comprises core-shell type silica ($SiO_2$@rGO) nanoparticles coated with reduced graphene oxide or titanium dioxide ($TiO_2$@ rGO) nanoparticles coated with reduced graphene oxide; and
      a second transparent conductive layer that is transparent and conductive, and that is disposed on the nanoparticle layer; and
   a second solar cell that is a perovskite solar cell which includes a perovskite layer and that is disposed on and bonded to the second transparent conductive layer of the recombination layer,
   wherein the recombination layer electrically joins the first solar cell to the second solar cell and planarizes the first solar cell so that the second solar cell is uniformly deposited in all regions thereof.

2. The integrated tandem solar cell of claim 1, wherein the first solar cell is a thin film solar cell containing copper indium gallium selenide (CIGS) and copper indium selenide (CIS) of a chalcopyrite series or copper zinc tin sulfide (CZTS) of a kesterite series.

3. The integrated tandem solar cell of claim 1, wherein the nanoparticle layer comprises nanoparticles of an oxide material that is transparent and conductive and that is selected from the group consisting of indium tin oxide, aluminum zinc oxide, zirconium tin oxide, a compound of indium and zinc oxide, and an oxide material containing indium, tin, and zinc.

4. The integrated tandem solar cell of claim 1, further comprising a bridge material that transfers charge between nanoparticles and that is ethyleneglycol or polyvinylpyridine.

5. The integrated tandem solar cell of claim 1, wherein the nanoparticle layer is a spin coated layer, a dip coated layer, a spray coated layer, an electrosprayed layer, or a successive ionic layer adsorption and reaction (SILAR) layer.

6. The integrated tandem solar cell of claim 1, wherein the first transparent conductive layer includes a zinc oxide layer which is an intrinsic semiconductor.

7. The integrated tandem solar cell of claim 1, wherein the second transparent conductive layer includes a transparent conductive layer that comprises an oxide material that has a high transmittance and a high conductivity and that is selected from the group consisting of indium tin oxide, aluminum zinc oxide, zirconium tin oxide, a compound of indium oxide and zinc oxide, and an oxide material containing indium, tin, and zinc.

8. A method of manufacturing an integrated tandem solar cell, comprising:
   forming a first solar cell that includes a rear electrode, a light absorption layer disposed on the rear electrode, and a buffer layer disposed on the light absorption layer;
   forming a recombination layer that is a triple layer structure including:
      a first transparent conductive layer that is transparent and conductive, and that is disposed on the buffer layer,
      a nanoparticle layer that is transparent and conductive, that is disposed on the first transparent conductive layer, that comprises nanoparticles, and that planarizes the first solar cell, wherein the nanoparticle layer has a thickness ranging from 70 nm to 100 nm and the nanoparticles have a size ranging from 1 nm to 20 nm; and wherein the nanoparticle layer is formed of silica ($SiO_2$@rGO) nanoparticles coated with a core-shell type reduced graphene oxide or titanium dioxide ($TiO_2$@ rGO) nanoparticles coated with reduced graphene oxide; and
      a second transparent conductive layer that is transparent and conductive, and that is disposed on the nanoparticle layer; and
   forming a second solar cell that is a perovskite solar cell which includes a perovskite layer, that is disposed on and bonded to the second transparent conductive layer of the recombination layer, and that is uniformly deposited in all regions thereof due to the nanoparticle layer planarizing the first solar cell.

9. The method of claim 8, wherein forming the nanoparticle layer is accomplished by spin coating, dip coating, spray coating (spraying), electrospraying, or a successive ionic layer adsorption and reaction (SILAR) method.

10. The method of claim 8, further comprising modifying a surface of the nanoparticle layer by heat treating followed by an ultraviolet (UV)-ozone treatment prior to disposing the second transparent conductive layer thereon.

11. The method of claim 8, wherein the first solar cell is a thin film solar cell containing copper indium gallium selenide (CIGS) and copper indium selenide (CIS) of a chalcopyrite series or copper zinc tin sulfide (CZTS) of a kesterite series.

12. The method of claim 8, wherein the nanoparticle layer comprises nanoparticles of an oxide material that is transparent and conductive and that is selected from the group consisting of indium tin oxide, aluminum zinc oxide, zirconium tin oxide, a compound of indium and zinc oxide, and an oxide material containing indium, tin, and zinc.

13. The method of claim 8, further comprising including a bridge material that transfers charge between nanoparticles and that is ethyleneglycol or polyvinylpyridine.

\* \* \* \* \*